(12) United States Patent
Liu et al.

(10) Patent No.: US 10,184,734 B2
(45) Date of Patent: Jan. 22, 2019

(54) HEAT DISSIPATION STRUCTURE AND HEAT DISSIPATION SYSTEM ADOPTING THE SAME

(71) Applicants: Tsinghua University, Beijing (CN); HON HAI PRECISION INDUSTRY CO., LTD., New Taipei (TW)

(72) Inventors: Chang-Hong Liu, Beijing (CN); Qing-Wei Li, Beijing (CN); Shou-Shan Fan, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 230 days.

(21) Appl. No.: 14/837,419

(22) Filed: Aug. 27, 2015

(65) Prior Publication Data

US 2015/0362266 A1   Dec. 17, 2015

Related U.S. Application Data

(62) Division of application No. 12/717,898, filed on Mar. 4, 2010.

(30) Foreign Application Priority Data

Aug. 5, 2009   (CN) .......................... 2009 1 0109568

(51) Int. Cl.
*H05K 7/20* (2006.01)
*F28F 21/02* (2006.01)
(Continued)

(52) U.S. Cl.
CPC .............. *F28F 21/02* (2013.01); *F28F 21/06* (2013.01); *F28F 21/08* (2013.01); *H01L 23/373* (2013.01);
(Continued)

(58) Field of Classification Search
CPC ...... F28F 21/02; F28F 21/06; F28F 2013/006; H01L 23/3733; H01L 23/3737; H05K 7/2039
(Continued)

(56) References Cited

U.S. PATENT DOCUMENTS 7,253,442 B2 *   8/2007   Huang .................. H01L 23/373
                                                                257/77
7,291,396 B2 *   11/2007   Huang .................. H01L 23/373
                                                                428/408
(Continued)

*Primary Examiner* — Leonard R Leo
(74) *Attorney, Agent, or Firm* — ScienBiziP, P.C.

(57) ABSTRACT

A heat dissipation structure includes a thermal interface material and a transition layer. The thermal interface material includes a matrix and a plurality of carbon nanotubes dispersed in the matrix. The thermal interface material has a first surface and a second surface opposite to the first surface. The transition layer is positioned on one of the first surface or the second surface of the thermal interface material. A thickness of the transition layer is in a range from about 1 nanometer to about 100 nanometers. The transition layer is in contact with the carbon nanotubes of the thermal interface material. An interface thermal resistance between the transition layer and the heat source is less than that between the plurality of carbon nanotubes and the heat source. The present application also relates to a heat dissipation system adopting the heat dissipation structure.

20 Claims, 6 Drawing Sheets

(51) Int. Cl.
  *F28F 21/06*    (2006.01)
  *F28F 21/08*    (2006.01)
  *F28F 13/00*    (2006.01)
  *H01L 23/373*    (2006.01)

(52) U.S. Cl.
  CPC ..... *F28F 2013/006* (2013.01); *H01L 23/3733* (2013.01); *H01L 23/3737* (2013.01); *H01L 2924/0002* (2013.01); *H05K 7/2039* (2013.01)

(58) Field of Classification Search
  USPC .............. 165/185; 428/408, 292.1; 361/704
  See application file for complete search history.

(56) References Cited

U.S. PATENT DOCUMENTS

| | | | |
|---|---|---|---|
| 7,393,428 B2 * | 7/2008 | Huang | H01L 23/373 156/249 |
| 8,064,203 B2 * | 11/2011 | Fairbank | B82Y 30/00 165/104.33 |
| 8,383,459 B2 * | 2/2013 | Supriya | H01L 23/3735 438/118 |
| 2005/0255304 A1 * | 11/2005 | Brink | H01L 23/373 428/209 |
| 2006/0286361 A1 * | 12/2006 | Yonetake | D01F 9/1276 428/293.1 |
| 2007/0054105 A1 * | 3/2007 | Hsiao | H01L 23/3733 428/292.1 |
| 2007/0244245 A1 * | 10/2007 | Liu | B82Y 30/00 428/408 |
| 2009/0266395 A1 * | 10/2009 | Murthy | F24J 2/06 136/206 |

\* cited by examiner

HEAT DISSIPATION STRUCTURE AND HEAT DISSIPATION SYSTEM ADOPTING THE SAME

CROSS-REFERENCE TO RELATED APPLICATIONS

This application is a division of U.S. patent application Ser. No. 12/717,898, filed on Mar. 4, 2010, "HEAT DISSIPATION STRUCTURE AND HEAT DISSIPATION SYSTEM ADOPTING THE SAME". The disclosures of the above-identified applications are incorporated herein by reference.

BACKGROUND

1. Technical Field

The present disclosure relates to heat dissipation structures and heat dissipation systems and, particularly, to a heat dissipation structure and a heat dissipation system adopting the same.

2. Description of Related Art

Electronic components such as semiconductor chips are becoming progressively smaller, while heat dissipation requirements are increasing. A thermal interface material is commonly utilized between the electronic component and a heat sink to efficiently dissipate heat generated by the electronic component.

A conventional thermal interface material is made by diffusing high heat conduction coefficiency particles in a base material. The particles can be made of graphite, boron nitride, silicon oxide, alumina, silver, or other metals. However, a heat conduction coefficiency of these thermal interface materials is now considered too low for many contemporary applications, because it cannot adequately meet the heat dissipation requirements of modern electronic components.

One thermal interface material, which conducts heat by using carbon nanotubes, has been developed. A matrix material is filled in interspaces between carbon nanotubes of a carbon nanotube array to take full advantage of the axial thermal conductive property of the carbon nanotubes. Ends of the carbon nanotubes extend out of the surface of the matrix. Example of the thermal interface material is taught by U.S. Pat. No. 7,253,442 to Huang et al. Referring to FIG. 6, the thermal interface material 40 includes a macromolecular material 32, and a plurality of carbon nanotubes 22 dispersed therein. The thermal interface material 40 has a first surface 42 and a second surface 44 opposite to the first surface 42. Ends of the carbon nanotubes 22 are exposed out of the first surface 42 and the second surface 44. The carbon nanotubes 22 are dispersed uniformly throughout the macromolecular material 32, and extend from the first surface 42 to the second surface 44. However, in use, when the carbon nanotubes 22 contact the heat sink or a heat source, the interface thermal resistance between the thermal interface material 40 and the heat sink or heat source is large because of the carbon nanotubes directly contacting the heat sink or heat source, thereby affecting the heat dissipation efficiency of the thermal interface material.

What is needed, therefore, is a heat dissipation structure with a low interface thermal resistance and a heat dissipation system adopting the same.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout several views.

DETAILED DESCRIPTION

The disclosure is illustrated by way of example and not by way of limitation in the figures of the accompanying drawings, in which like references indicate similar elements. It should be noted that references to "an" or "one" embodiment in this disclosure are not necessarily to the same embodiment, and such references mean at least one.

Figure 1:
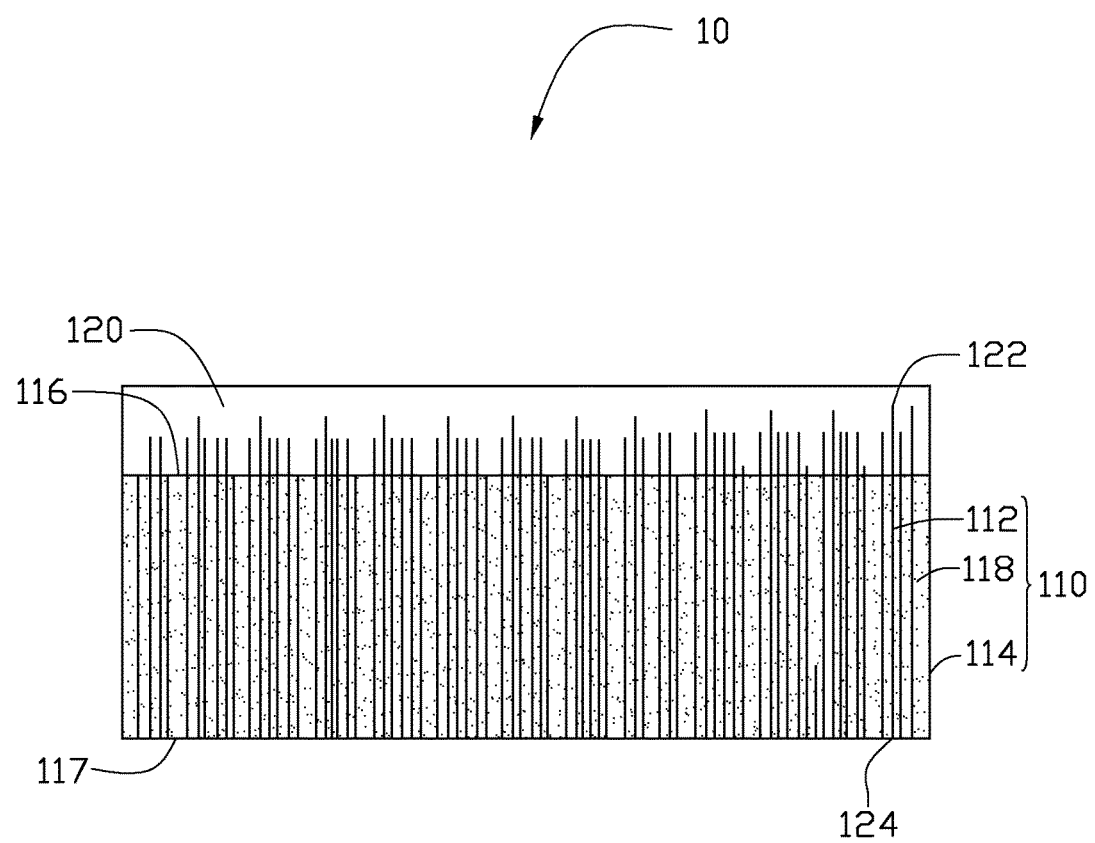
FIG. 1 is a schematic structural view of a first embodiment of a heat dissipation structure.

Referring to FIG. 1, a first embodiment of a heat dissipation structure 10 includes a thermal interface material 110 and a transition layer 120. The thermal interface material 110 has a first surface 116 and a second surface 117 opposite to the first surface 116. The transition layer 120 is positioned on the first surface 116 of the thermal interface material 110.

The thermal interface material 110 includes a matrix 114 and a plurality of carbon nanotubes 112 dispersed in the matrix 114. A material of the matrix 114 includes a phase change material, such as resin material, thermal plastic, rubber, silicone, and a mixture thereof. The resin includes epoxy resin, acrylic resin or silicone resin. In one embodiment, the material of the matrix 114 is silicon elastomer kit.

The plurality of carbon nanotubes 112 can be substantially parallel to each other, and substantially perpendicular to the first surface 116 of the thermal interface material 110. One end of each of the plurality of carbon nanotubes 112 extends out of the first surface 116 of the thermal interface material 110. In one embodiment, the plurality of carbon nanotubes 112 forms a carbon nanotube array distributed in the matrix 114. A height of the carbon nanotubes 112 can be set as desired. Each of the carbon nanotubes 112 includes a first end 122 and a second end 124 opposite to the first end 122. A mass percent of the carbon nanotubes 112 in the thermal interface material 110 can be in a range from about 0.1% to about 5%. In one embodiment, the mass percent of the plurality of carbon nanotubes 112 in the thermal interface material 110 is about 2%. The carbon nanotubes 112 can be single-walled carbon nanotubes, multi-walled carbon nanotubes, or any combination thereof.

In one embodiment, the first surface 116 of the thermal interface material 110 is substantially parallel to the second surface 117. The carbon nanotubes are multi-walled carbon nanotubes, and the multi-walled carbon nanotubes form a multi-walled carbon nanotube array. The carbon nanotubes 112 are substantially parallel to each other and substantially perpendicular to the first surface 116 and the second surface 117.

The carbon nanotubes 112 extend from the second surface 117 to the first surface 116. The first ends 122 of the carbon nanotubes 112 are at the first end of the carbon nanotube array. The second ends 124 of the carbon nanotubes 112 are at the second end of the carbon nanotube array. The first end of the carbon nanotube array extends substantially out of the first surface 116.

The first ends 122 of the plurality of carbon nanotubes 112 are buried in the transition layer 120. A material of the transition layer 120 can be silicone, polyethylene glycol, polyethylene, polyester, epoxy resin, hypoxia glue, glue series of acrylic, or rubber. The polyester includes polymethylmethacrylate (PMMA). In another embodiment, the material for the transition layer 120 is silicone.

The interface thermal resistance between the transition layer 120 and the heat sink or the heat source is less than that between the carbon nanotubes and the heat sink or the heat source. A thickness of the transition layer 120 cannot be too great. An interface thermal resistance between the heat dissipation structure 10 and the heat sink or the heat source depends on the thermal resistance of the transition layer 120 and the interface thermal resistance between the transition layer 120 and the heat sink or the heat source. If the thickness of the transition layer 120 is too great, the thermal resistance of the transition layer 120 would be too high, resulting in a high interface thermal resistance between the heat dissipation structure 10 and the heat sink or the heat source. If the thickness of the transition layer 120 is too small, the interface thermal resistance between the transition layer 120 and the heat sink or the heat source would also be high, resulting in a high interface thermal resistance between the heat dissipation structure 10 and the heat sink or the heat source. Thus, the thickness of the transition layer 120 can be in a range from about 1 nanometer to about 100 nanometers. In one embodiment, a thickness of the transition layer 120 is about 50 nanometers.

The heat dissipation structure 10 can further include a plurality of thermal conductive particles 118. The plurality of thermal conductive particles 118 can be dispersed in the matrix 114. The plurality of thermal conductive particles 118 has a high heat conduction coefficient, and can improve the heat conduction coefficiency of the heat dissipation structure 10. The thermal conductive particles 118 are at least one of metal particles, alloy particles, oxide particles, and non-metal particles. The metal particles can be tin, copper, indium, lead, antimony, gold, silver, bismuth, aluminum, or other metals. The alloys can be tin, copper, indium, lead, antimony, gold, silver, bismuth, aluminum, or any combination thereof. The oxide particles can be made of metal oxides or silicon oxides. The non-metal particles can be made of graphite or silicon. In one embodiment, the thermal conductive particles 118 are graphite particles. It is understood that the thermal conductive particles 118 are optional.

The heat dissipation structure 10 is applied to an electronic device, the plurality of carbon nanotubes 112 can contact with the electronic device by the transition layer 120. The transition layer 120 can effectively reduce the interface resistance between the heat dissipation structure 10 and the electronic device, and ensure the thermal conductive properties of the carbon nanotubes along the axis direction (e.g., the length of the carbon nanotube) is being fully utilized. Thus, a high interface resistance because of the carbon nanotubes directly contacting the electronic device can be avoided. The heat dissipation efficiency of the heat dissipation structure 10 is increased. Furthermore, the plurality of thermal conductive particles 118 can also increase the heat conduction coefficiency of the matrix 114, thereby increasing the heat conduction coefficiency of the heat dissipation structure 10.

It is understood that the carbon nanotubes 112 in the heat dissipation structure 10 can be replaced by carbon fibers or a combination of carbon nanotubes and carbon fibers.

The heat dissipation structure 10 can be prepared by the following steps. Firstly, a carbon nanotube array is supplied. The carbon nanotube array includes a plurality of carbon nanotubes 112. A liquid matrix material and a plurality of thermal conductive particles 118 are filled in interspaces of the carbon nanotubes 112 in the carbon nanotube array. Thereby, the thermal interface material 110 having the matrix 114, and the plurality of carbon nanotubes 112 and the plurality of thermal conductive particles 118 dispersed in the matrix 114, is formed. The thermal interface material 110 has the first surface 116 and the second surface 117 opposite to the first surface 116. The plurality of carbon nanotubes 112 have first ends 122 exposed out of a first surface 116 of the thermal interface material 110. The transition layer 120 is formed on the first surface 116 of the thermal interface material 110. The first ends 122 of the plurality of carbon nanotubes 112 are buried in the transition layer 120.

The carbon nanotube array can be formed on a substrate, with the second ends 124 of the carbon nanotubes 112 contacting with the substrate.

The thermal interface material 110 can be formed by the following steps. The plurality of thermal conductive particles 118 is dispersed in a liquid matrix material to form a mixture. The carbon nanotube array on the substrate is immersed in the mixture. The mixture fills in the interspaces of the carbon nanotubes 112 in the carbon nanotube array. The carbon nanotube array with the substrate is then taken out. The liquid matrix material is cured to form the matrix 114. The second surface 117 of the thermal interface material 110 is adjacent to the substrate. The first surface of the thermal interface material 110 is etched so that the first ends 122 of the plurality of carbon nanotubes 112 are exposed out of the first surface 116. Then, the substrate is removed. The carbon nanotube array is cut along a direction of the axis thereof, with a slicing machine, thereby forming the thermal interface material 110. The second ends 124 of the plurality of carbon nanotubes 112 are coplanar with the second surface 117.

It is understood that the matrix 114 can be free of the plurality of thermal conductive particles 118.

The step of forming the transition layer 120 on the first surface 116 can be executed by coating a solution of the transition layer 120 on the first surface 116 by spin-coating, printing, brushing, or other coating methods. A thickness of the transition layer 120 can be in a range from about 1 nanometer to about 100 nanometers.

The step of forming the transition layer 120 on the first surface 116 can be executed by coating a precursor solution of the transition layer 120 on the first surface 116 and then curing the precursor solution of the transition layer 120 to form the transition layer 120. For example, a silicone rubber solution can be coated to the first surface 116, and then the silicone rubber solution is cured to form the first transition layer 120.

Figure 2:
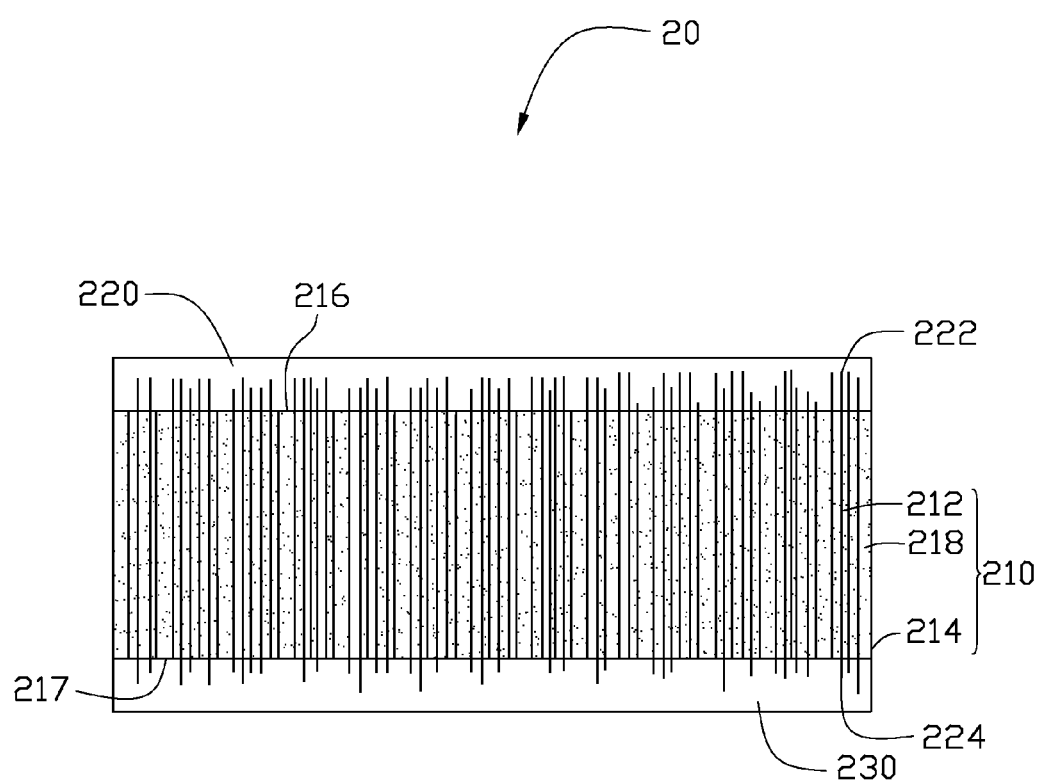
FIG. 2 is a schematic structural view of a second embodiment of a heat dissipation structure.

Referring to FIG. 2, a second embodiment of a heat dissipation structure 20 includes a thermal interface material 210 and a first transition layer 220 and a second transition layer 230. The thermal interface material 210 includes a first surface 216 and a second surface 217 opposite to the first surface 216. The first transition layer 220 is positioned on the first surface 216 of the thermal interface material 210. The second transition layer 230 is positioned on the second surface 217 of the thermal interface material 210.

The thermal interface material 210 includes a matrix 214, a plurality of carbon nanotubes 212 and a plurality of thermal conductive particles 218. The plurality of carbon nanotubes 212 and the plurality of thermal conductive particles 218 are dispersed in the matrix 214. The plurality of carbon nanotubes 212 is substantially perpendicular to the first surface 216 of the thermal interface material 210. The plurality of carbon nanotubes 212 includes first ends 222 and second ends 224 opposite to the first ends 222. Each of the plurality of carbon nanotubes 212 includes a first part, and the first part protrudes out of the first surface 216 and is embedded in the first transition layer 220. Thus, there are a plurality of the first part in the first transition layer 220. The plurality of the first parts have different lengths. Each of the plurality of first part is entirely embedded in the first transition layer 220.

The second embodiment of the heat dissipation structure 20 is similar to the first embodiment of the heat dissipation structure 10, except that the first ends 222 of the plurality of carbon nanotubes 212 extends out of the first surface 216 of the thermal interface material 210, and the second ends 224 of the plurality of carbon nanotubes 212 extends out of the second surface 217 of the thermal interface material 210. The first transition layer 220 covers the first surface 216 of the thermal interface material 210. The first ends 222 of the plurality of carbon nanotubes 212 are buried in the first transition layer 220. The second transition layer 230 covers the second surface 217 of the thermal interface material 210. The second ends 224 of the plurality of carbon nanotubes 212 are buried in the second transition layer 230. A thickness of the first transition layer 220 and the second transition layer 230 is in a range from about 1 nanometer to about 100 nanometers. In one embodiment, the thickness of the first transition layer 220 and the second transition layer 230 is about 50 nanometers. A material of the first transition layer 220 and the second transition layer 230 is the same as the transition layer 120 in the heat dissipation structure 10.

The heat dissipation structure 20 can be prepared by the following steps. A carbon nanotube array is provided. The carbon nanotube array includes a plurality of carbon nanotubes 212. A liquid matrix material and a plurality of thermal conductive particles 218 are filled in interspaces of the carbon nanotubes 212 in the carbon nanotube array. Thereby, the thermal interface material 210 having the matrix 214, the plurality of carbon nanotubes 212 and the plurality of thermal conductive particles 218 dispersed therein, is formed. The plurality of carbon nanotubes 212 has first ends 222 exposed out of a first surface 216 and second ends 224 exposed out of the second surface 217. The first transition layer 220 is formed on the first surface 216, and the second transition layer 230 is formed on the second surface 217. The first ends of the plurality of carbon nanotubes 212 are buried in the transition layer 220. The second ends of the plurality of carbon nanotubes 212 are buried in the second transition layer 230.

The method for preparing the second embodiment of the heat dissipation structure 20 is similar to the method for preparing the first embodiment of the heat dissipation structure 10, except that the step for forming the thermal interface material 210 further comprises having the second ends 224 of the plurality of carbon nanotubes 212 exposed out of the second surface 217. After removing the substrate on which the carbon nanotube array is grown, the second surface 217 of the thermal interface material 210 is etched to expose the second ends 224 of the plurality of carbon nanotubes 212 out of the second surface 217 of the thermal interface material 210. A step for forming the second transition layer 230 on the second surface 217 is further provided.

Both ends of the plurality of carbon nanotubes 212, when the heat dissipation structure 20 is applied to an electronic device, contact with the electronic device or heat sink by the first transition layer 220 or the second transition layer 230. This can reduce the interface resistance between them effectively, thereby increasing the heat dissipation efficiency of the heat dissipation structure 20.

Figure 3:
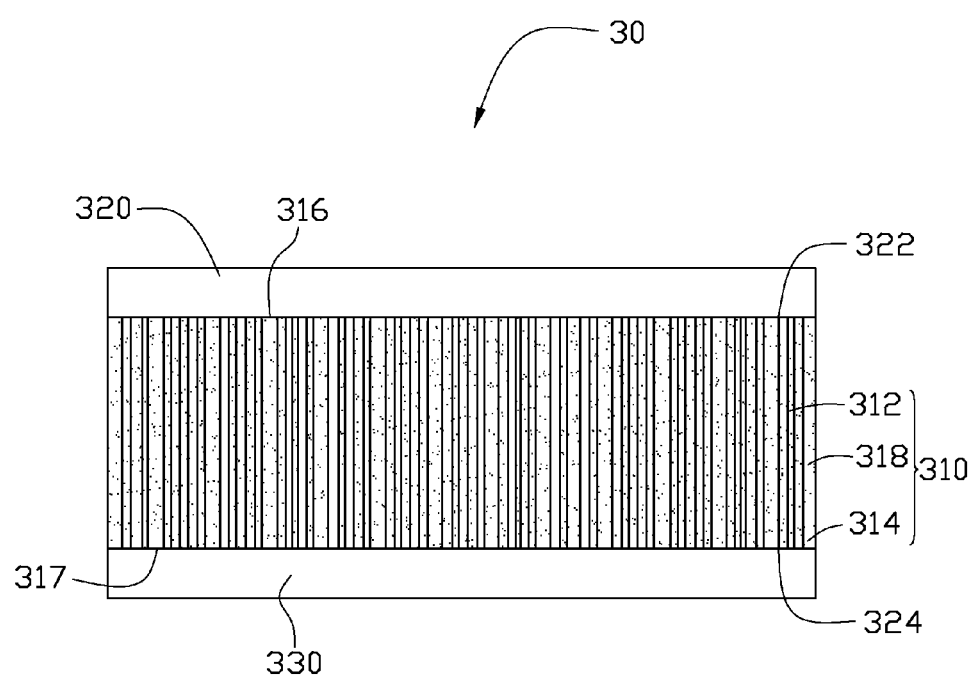
FIG. 3 is a schematic structural view of a third embodiment of a heat dissipation structure.

Referring to FIG. 3, a third embodiment of a heat dissipation structure 30 includes a thermal interface material 310 and a first transition layer 320 and a second transition layer 330. The thermal interface material 310 includes a first surface 316 and a second surface 317 opposite to the first surface 316. The first transition layer 320 is positioned on the first surface 316 of the thermal interface material 310. The second transition layer 330 is positioned on the second surface 317 of the thermal interface material 310.

The thermal interface material 310 includes a matrix 314, a plurality of carbon nanotubes 312 and a plurality of thermal conductive particles 318. The plurality of carbon nanotubes 312 and the plurality of thermal conductive particles 318 are dispersed in the matrix 314. The plurality of carbon nanotubes 312 is substantially perpendicular to the first surface 316 of the thermal interface material 310. The plurality of carbon nanotubes 312 includes first ends 322 and second ends 324 opposite to the first ends 322.

The third embodiment of the heat dissipation structure 30 is similar to the second heat dissipation structure 20, except that the first ends 322 of the plurality of carbon nanotubes 312 are coplanar with the first surface 316 of the thermal interface material 310, and the second ends 324 of the plurality of carbon nanotubes 312 are coplanar with the second surface 317 of the thermal interface material 310.

The heat dissipation structure 30 can be prepared by the following steps. A carbon nanotube array is provided. The carbon nanotube array includes a plurality of carbon nanotubes 312. A liquid matrix material and a plurality of thermal conductive particles 318 are filled in interspaces of the carbon nanotubes 312 in the carbon nanotube array. Thereby, the thermal interface material 310 having the matrix 314, the plurality of carbon nanotubes 312 and the plurality of thermal conductive particles 318 dispersed therein, is formed. The plurality of carbon nanotubes 312 has the first ends 322 coplanar with the first surface 316 and the second ends 324 coplanar with the second surface 317. The first transition layer 320 is formed on the first surface 316. The first ends 322 of the plurality of carbon nanotubes 312 are buried in the first transition layer 320. Thus, the second transition layer 330 is formed on the second surface 317. The second ends 324 of the plurality of carbon nanotubes 312 are buried in the second transition layer 330.

The method for preparing the third embodiment of the heat dissipation structure 30 is similar to the method for preparing the second embodiment of the heat dissipation structure 20, except that a cutting process is used to make the plurality of carbon nanotubes 312 having first ends 322 coplanar with the first surface 316 and second ends 324 coplanar with the second surface 317.

Figure 4:
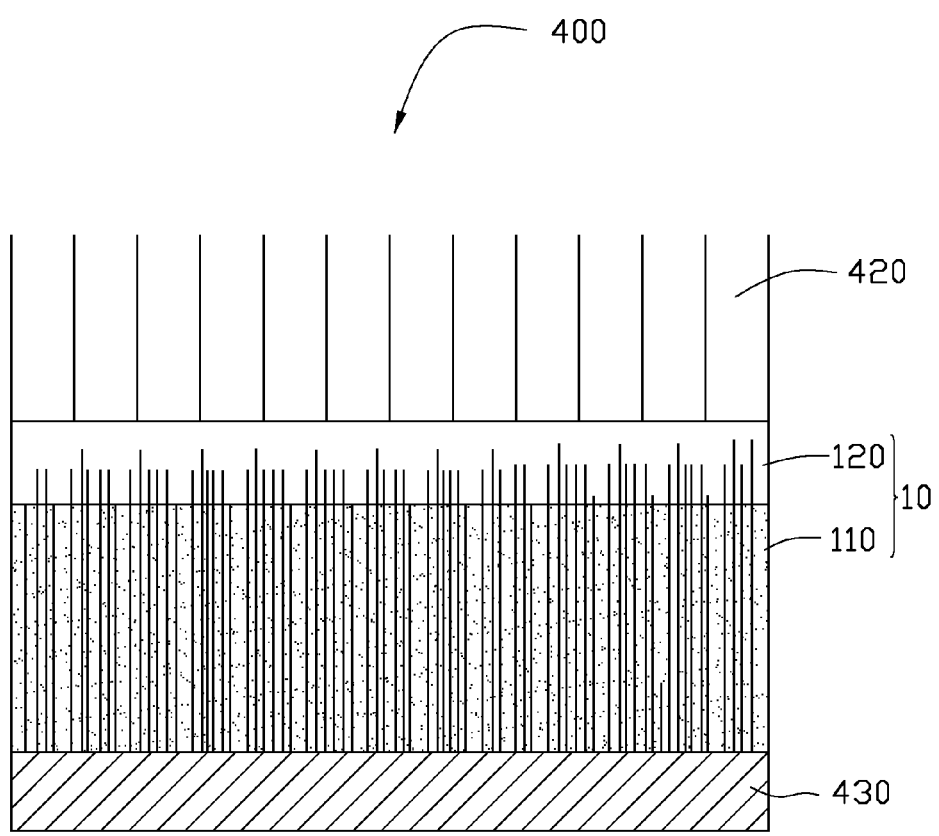
FIG. 4 is a schematic structural view of one embodiment of a heat dissipation system.

Referring to FIG. 4, one embodiment of a heat dissipation system 400 adopting the first embodiment of the heat dissipation structure 10 includes a heat sink 420, the heat dissipation structure 10 and a heat source 430 mounted in sequence.

The transition layer 120 of the heat dissipation structure 10 can contact directly with the heat sink 420. The thermal interface material 110 can contact directly with the heat source 430. The heat sink 420 can be a metal heat sink. In one embodiment, the heat sink 420 is copper heat sink. The heat source 430 can be chips, power transistors, CPU and other electronic devices. In one embodiment, the heat source 430 is a chip.

Figure 5:
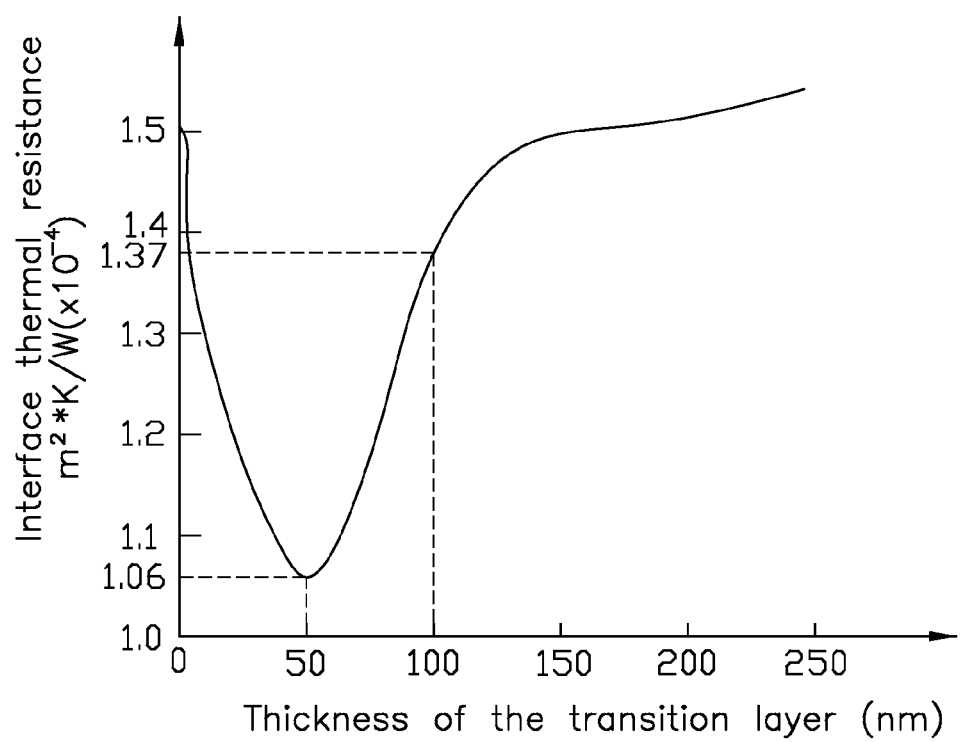
FIG. 5 is a graph of an interface thermal resistance between the heat dissipation structure and the heat sink as a function of a thickness of a transition layer.
Figure 6:
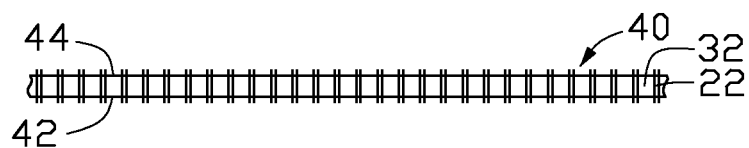
FIG. 6 is a schematic structural view of a conventional thermal interface material.

Referring to FIG. 5, a graph of an interface thermal resistance between the heat dissipation structure 10 and the heat sink 420 as a function of a thickness of the transition layer 120 is shown. The interface thermal resistance between the heat dissipation structure 10 and the heat sink 420 is about $1.52 \times 10^{-4}$ $m^2 \cdot K/W$ when the heat dissipation structure 10 is without the transition layer 120. The interface thermal resistance between the heat dissipation structure 10 and the heat sink 420 is reduced to about $1.37 \times 10^{-4}$ $m^2 \cdot K/W$ when the thickness of the heat dissipation structure 10 is about 1 nanometer, because the interface thermal resistance between the transition layer 120 and the heat sink 420 is lower than that between the carbon nanotubes and the heat sink 420, and the thermal resistance of the transition layer 120 is less than the interface thermal resistance between the transition layer 120 and the heat sink 420. The interface thermal resistance between the transition layer 120 and the heat sink 420 is reduced gradually with the increase of the thickness of the transition layer 120. The interface thermal resistance between the heat dissipation structure 10 and the heat sink 420 is lowest and reaches about $1.06 \times 10^{-4}$ $m^2 \cdot K/W$ when the thickness of the transition layer 120 is increased to about 50 nanometers.

The thermal resistance of the transition layer 120 dominates the interface thermal resistance between the heat dissipation structure 10 and the heat sink 420 when the thickness of the transition layer 120 is greater than about 50 nanometers. The larger the thickness of the transition layer 120, the larger the thermal resistance of the transition layer 120, and thus the larger the interface thermal resistance between the heat dissipation structure 10 and the heat sink 420. The interface thermal resistance between the heat dissipation structure 10 and the heat sink 420 reaches about $1.37 \times 10^{-4}$ $m^2 \cdot K/W$ when the thickness of the transition layer 120 is increased to about 100 nanometers. The interface thermal resistance between the heat dissipation structure 10 and the heat sink 420 is increased sharply to about $1.52 \times 10^{-4}$ $m^2 \cdot K/W$ when the thickness of the transition layer 120 is larger than about 100 nanometers. In one embodiment, the thickness of the transition layer 120 is in a range from about 1 nanometer to about 100 nanometers, the interface thermal resistance between the heat dissipation structure 10 and the heat sink 420 is low, and the heat dissipation system 400 adopting the heat dissipation structure 10 has a good heat dissipation effect.

It is understood that the second embodiment of the heat dissipation structure 20 or the third embodiment of the heat dissipation structure 30 can also be applied to the heat dissipation system 400 in a similar way.

The heat dissipation structure 10, 20, 30 and the heat dissipation system 400 adopting the same have merits. Firstly, since the interface thermal resistance between the transition layer 120, 220, 230, 320, 330 and the heat source is less than that between the plurality of carbon nanotubes 112, 212, 312 and the heat source, the interface thermal resistance between the transition layer 120, 220, 230, 320, 330 and the heat sink or heat source is reduced, thereby avoiding the high interface thermal resistance caused by the two ends of the carbon nanotubes 112, 212, 312 directly contacting with the heat sink or heat source. Thus, the heat dissipation efficiency of the heat dissipation structure 10, 20, 30 and the heat dissipation system 400 is increased. Secondly, the plurality of thermal conductive particles 118, 218, 318 can also increase the heat conduction coefficient of the matrix 114, 214, 314, thereby increasing the heat conduction coefficient of the heat dissipation structure 10, 20, 30 and the heat dissipation system 400 adopting the same. Lastly, the method for producing the heat dissipation structure 10, 20, 30 is simple.

It is to be understood that the above-described embodiment is intended to illustrate rather than limit the disclosure. Variations may be made to the embodiment without departing from the spirit of the disclosure as claimed. The above-described embodiments are intended to illustrate the scope of the disclosure and not restricted to the scope of the disclosure.

It is also to be understood that the above description and the claims drawn to a method may include some indication in reference to certain steps. However, the indication used is only to be viewed for identification purposes and not as a suggestion as to an order for the steps.

What is claimed is:

1. A heat dissipation structure for dissipating heat from a heat source, comprising:
    a thermal interface material comprising a matrix and a plurality of carbon nanotubes dispersed in the matrix, the thermal interface material having a first surface and a second surface that is opposite to the first surface, wherein each of the plurality of carbon nanotubes consists of a first part, a second part, and a third part;
    a first transition layer positioned on the first surface, wherein the first part protrudes out of the first surface and is embedded in the first transition layer, the first transition layer comprising a plurality of first parts, the first parts of the plurality of first parts having different lengths, and each first part of the plurality of first parts is entirely embedded in the first transition layer; and the second part is inside of the matrix, and a first length direction of the first part is parallel to a second length direction of the second part; and
    a second transition layer positioned on the second surface, wherein the third part protrudes out of the second surface and is embedded in the second transition layer, and a thickness of each of the first transition layer and the second transition layer is about 50 nanometers.

2. The heat dissipation structure of claim 1, wherein the first transition layer and the second transition layer are made of silicon.

3. The heat dissipation structure of claim 1, wherein a material of the matrix comprises resin material, thermal plastic, rubber, silicone, or a mixture thereof.

4. The heat dissipation structure of claim 1, wherein the plurality of carbon nanotubes are substantially parallel to each other and substantially perpendicular to the first surface and the second surface.

5. The heat dissipation structure of claim 1, further comprising a plurality of thermal conductive particles dispersed in the matrix.

6. The heat dissipation structure of claim 5, wherein the plurality of thermal conductive particles are at least one of metal particles, alloy particles, oxide particles, and non-metal particles.

7. The heat dissipation structure of claim 1, wherein the first part, the second part, and the third part are connected to each other and extend along a same straight line.

8. The heat dissipation structure of claim 1, wherein each of the plurality of carbon nanotubes has a first end and a second end opposite to the first end, the first end is embedded in the first transition layer, and the second end is embedded in the second transition layer.

9. A heat dissipation system, comprising:
a heat sink;
a heat source; and
a heat dissipation structure positioned between the heat sink and the heat source, the heat dissipation structure comprising:
a thermal interface material comprising a matrix and a plurality of carbon nanotubes dispersed in the matrix, the thermal interface material having a first surface and a second surface opposite to the first surface, wherein each of the plurality of carbon nanotubes consists of a first part, a second part, and a third part;
a first transition layer positioned on the first surface, wherein the first part protrudes out of the first surface and is embedded in the first transition layer, the first transition layer comprising a plurality of first parts, the first parts of the plurality of first parts having different lengths, and each first part of the plurality of first parts is entirely embedded in the first transition layer; and the second part is inside of the matrix, and a first length direction of the first part is parallel to a second length direction of the second part; and
a second transition layer positioned on the second surface, wherein the third part protrudes out of the second surface and is buried in the second transition layer, and a thickness of each of the first transition layer and the second transition layer is about 50 nanometers.

10. The heat dissipation system of claim 9, wherein the first transition layer and the second transition layer are made of silicon.

11. The heat dissipation structure of claim 9, wherein the plurality of carbon nanotubes are substantially parallel to each other and substantially perpendicular to the first surface and the second surface.

12. The heat dissipation structure of claim 9, further comprising a plurality of thermal conductive particles dispersed in the matrix.

13. The heat dissipation structure of claim 12, wherein the plurality of thermal conductive particles are at least one of metal particles, alloy particles, oxide particles, and non-metal particles.

14. The heat dissipation structure of claim 9, wherein each of the plurality of carbon nanotubes has a first end and a second end opposite to the first end, the first end is embedded in the first transition layer, and some second ends are embedded in the second transition layer.

15. The heat dissipation structure of claim 9, wherein an interface thermal resistance between the heat dissipation structure and the heat sink is about $1.06 \times 10^{-4}$ $m^2 \cdot K/W$.

16. A heat dissipation system, comprising:
a heat sink, a heat dissipation structure and a heat source mounted in sequence; the heat dissipation structure comprising:
a thermal interface material comprising a matrix and a plurality of carbon nanotubes dispersed in the matrix, wherein the thermal interface material has a first surface, and each of the plurality of carbon nanotubes comprises a first part and a second part; and
a first transition layer positioned on the first surface, wherein the first part protrudes out of the first surface and is embedded in the first transition layer, the second part is inside of the matrix, a first length direction of the first part is parallel to a second length direction of the second part, a thickness of the first transition layer is about 50 nanometers, and an interface thermal resistance between the heat dissipation structure and the heat sink is about $1.06 \times 10^{-4}$ $m^2 \cdot K/W$.

17. The heat dissipation system of claim 16, wherein the first transition layer is made of silicon.

18. The heat dissipation structure of claim 16, wherein the plurality of carbon nanotubes are substantially parallel to each other and substantially perpendicular to the first surface.

19. The heat dissipation structure of claim 16, wherein the heat dissipation structure further comprises a second transition layer positioned on a surface of the thermal interface material opposite to the first surface, each of the plurality of carbon nanotubes further comprises a third part, and the third part protrudes out of the thermal interface material and is embedded in the second transition layer.

20. The heat dissipation structure of claim 16, further comprising a plurality of thermal conductive particles dispersed in the matrix.

* * * * *